United States Patent
Tihanyi

(10) Patent No.: US 6,459,142 B1
(45) Date of Patent: Oct. 1, 2002

(54) POWER MOSFET

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/616,620

(22) Filed: Jul. 14, 2000

Related U.S. Application Data

(63) Continuation of application No. PCT/DE98/03589, filed on Dec. 7, 1998.

Foreign Application Priority Data

Jan. 14, 1998 (DE) .......................................... 198 01 095

(51) Int. Cl.⁷ .............................................. H01L 29/40
(52) U.S. Cl. ...................... 257/621; 257/513; 257/514; 257/520; 257/774; 257/328; 257/302; 257/330
(58) Field of Search ................................. 257/621, 513, 257/514, 520, 774, 328, 302, 330

(56) References Cited

U.S. PATENT DOCUMENTS

| | | | |
|---|---|---|---|
| 3,986,196 A | | 10/1976 | Decker et al. |
| 4,252,582 A | * | 2/1981 | Anantha et al. ............. 148/175 |
| 4,378,630 A | * | 4/1983 | Horng et al. ................. 29/580 |
| 4,819,052 A | * | 4/1989 | Hutter ......................... 357/49 |
| 4,992,764 A | | 2/1991 | Ayasli |
| 5,128,737 A | * | 7/1992 | van der Have ............... 357/40 |
| 5,479,048 A | * | 12/1995 | Yallup et al. ............... 257/621 |
| 5,485,027 A | * | 1/1996 | Williams et al. ............ 257/343 |
| 5,559,353 A | * | 9/1996 | Risch et al. ................. 257/334 |
| 5,578,841 A | * | 11/1996 | Vasquez et al. ............. 257/220 |
| 5,635,753 A | * | 6/1997 | Hofflinger et al. .......... 257/621 |
| 5,741,737 A | * | 4/1998 | Kachelmeier ............... 438/286 |
| 5,889,306 A | * | 3/1999 | Christensen et al. ........ 257/350 |
| 5,929,481 A | * | 7/1999 | Hshieh et al. ............... 257/328 |
| 6,069,386 A | * | 5/2000 | Jos ............................. 257/339 |
| 6,121,661 A | * | 9/2000 | Assaderaghi et al. ....... 257/355 |
| 6,146,951 A | * | 11/2000 | Choi ........................... 438/281 |
| 6,190,978 B1 | * | 2/2001 | D'Anna ....................... 438/301 |

FOREIGN PATENT DOCUMENTS

| | | | |
|---|---|---|---|
| DE | 1 933 731 | | 2/1970 |
| EP | 0 098 167 A2 | | 1/1984 |
| EP | 0 174 712 A2 | | 3/1986 |
| EP | 0 446 125 A1 | | 9/1991 |
| EP | 0 596 364 A2 | | 5/1994 |
| EP | 596364 A3 | * | 5/1994 |
| JP | 06151989 | * | 5/1994 ................. 257/661 |
| JP | 11111856 | * | 4/1999 |

OTHER PUBLICATIONS

Wolf et al., Silicon Processing for the VLSI Era, Lattice Press, vol. 1, p. 124.*
"Power Mosfets, Theory and Applications" (Grant et al.), dated 1989, pp. 12–14.

* cited by examiner

Primary Examiner—Eddie Lee
Assistant Examiner—Eugene Lee
(74) Attorney, Agent, or Firm—Laurence A. Greenberg; Werner H. Stemer; Gregory L. Mayback

(57) ABSTRACT

The power MOSFET has a semiconductor layer formed on a highly doped semiconductor substrate of a first conductivity type. The semiconductor layer is itself of the other conductivity type and a highly doped source zone of the other conductivity type and a highly doped drain zone of the other conductivity type are formed in the semiconductor layer. The power MOSFET also has a gate electrode. A metallically conductive connection runs between the source zone and the semiconductor substrate, so that the power MOSFET is in the form of a source-down MOSFET, and the heat can be dissipated via the semiconductor substrate or a cooling fin fitted there.

27 Claims, 4 Drawing Sheets

POWER MOSFET

CROSS-REFERENCE TO RELATED APPLICATION

This is a continuation of copending international application PCT/DE98/03589, filed Dec. 7, 1998, which designated the United States.

BACKGROUND OF THE INVENTION

Field of the Invention

The invention lies in the semiconductor technology field. More specifically, the invention relates to a power MOSFET having a semiconductor layer, which is arranged on a highly doped semiconductor substrate of a first conductivity type, is itself of the other conductivity type, in which a highly doped source zone of the other conductivity type and a highly doped drain zone of the other conductivity type are formed. A gate electrode is provided above the semiconductor zone of the first conductivity type.

In power MOSFETs, the cooling of the MOSFET and heat dissipation from the semiconductor body play a crucial role. This would be very simple if, for example in the case of an n-channel MOSFET, its semiconductor substrate, which may be equipped with a cooling fin, could be screwed directly onto a body which absorbs heat, such as the bodywork of an automobile. A precondition for this that the semiconductor substrate and, with it the source zone, may be at zero volts without adversely affecting the other characteristics of the MOSFET, that is say, for example, without it having an excessively high switch-on resistance.

SUMMARY OF THE INVENTION

The object of the invention is to provide a power MOSFET which overcomes the above-noted deficiencies and disadvantages of the prior art devices and methods of this kind, and the semiconductor substrate of which can be cooled at a voltage of 0 volts, and the power MOSFET does not have an excessively high switch-on resistance.

With the above and other objects in view there is provided, in accordance with the invention, a power MOSFET, comprising:

a highly doped semiconductor substrate of a first conductivity type;

a semiconductor layer of a second conductivity type on the semiconductor substrate;

a highly doped source zone of the second conductivity type and a highly doped drain zone of the second conductivity type formed in the semiconductor layer;

a semiconductor zone of the first conductivity type and a gate electrode above the semiconductor zone; and a highly conductive connection between the source zone and a surface of the semiconductor substrate opposite the semiconductor layer.

In other words, the novel power MOSFET has a highly conductive connection between the source zone and the semiconductor substrate. This highly conductive connection may be, in particular, a metallically conductive connection.

In the present invention, the metallically conductive connection is provided between the source zone on one face surface of the power MOSFET and the opposite surface of the semiconductor substrate, so that the semiconductor substrate and, with it the source zone, can be screwed, for example by means of a cooling fin other similar heat sink, onto a base, for example the bodywork of an automobile, with the semiconductor substrate, and thus the source zone, being at 0 volts. With the semiconductor substrate in such a structure, the source zone is "at the bottom", for which reason this is referred to as a "source-down" FET.

The actual MOSFET may have a conventional structure in the semiconductor layer, in which the gate electrode is embedded in an insulator layer provided on the semiconductor layer. However, it also possible for the gate electrode to be accommodated in a trench in the semiconductor layer, with, for example, the edge of such a trench being lined with an insulator layer composed of silicon dioxide or silicon nitride, and whose interior is filled with doped polycrystalline silicon.

The conductive connection between the source zone and the semiconductor substrate may be formed from a highly doped semiconductor zone of the first conductivity type. However, it is also possible for this conductive connection to provide a trench out of which dopant of the first conductivity type is then diffused, and which is filled with polycrystalline or monocrystalline silicon. Another option for the configuration of the conductive connection comprises a trench which is at least partially filled with metal or a highly conductive layer. Titanium nitride may preferably be used for such a layer. Apart from this, the interior of the trench can be filled with polycrystalline silicon, which is doped with dopant of the other conductivity type.

The semiconductor substrate itself may be provided directly with a cooling device, for example a cooling fin, which can be screwed onto a base. This results in particularly effective heat dissipation.

The semiconductor layer is preferably more lightly doped between the drain zone and the gate electrode than in the drain zone. This allows the MOSFET to be operated at higher voltages. Such operation is also assisted if the distance between the drain zone and the edge of the gate electrode is at least 0.1 µm to approximately 5 µm. The thickness of the insulator layer should also preferably increase continuously or in steps in the direction of the drain zone.

The contact between the highly doped source doped zone and the conductive connection may be produced by means of a buried metal, for example a silicide or some other conductive layer, for example composed of titanium nitride.

The insulator layer, which is composed of silicon dioxide, is deposited over the short-circuit point between the highly doped source zone and the conductive connection. It is also possible to interrupt the metalllization there for the drain zone, that is to say for example an aluminum layer.

The gate electrodes may be arranged like a grid and a "network" composed of polycrystalline silicon of the other conductivity type is formed, which is embedded in the insulator layer composed of silicon dioxide or some other material, such as silicon nitride.

The highly doped drain zones of the other conductivity type preferably make contact with a metal layer over the entire surface and composed, for example, of aluminum which may be in the form of a grid, if the individual source zones have an aluminum short circuit which extends up to their surface.

There should be a distance of between several tenths of 1 µm and 5 µm in the insulator layer, between the highly doped drain zone of the other conductivity type and the edge of the gate electrode, which is composed of polycrystalline silicon, in order to achieve a high withstand voltage. This is also required if the thickness of the insulator layer in the region of the gate electrode increases in steps or continuously in the direction of the drain zone. The drain zone may also be located higher or lower than the source zone with respect to the semiconductor surface.

If a highly doped zone of the first conductivity type is used for the conductive connection, then this zone can be produced in a similar way to that for insulation diffusion or that for integrated circuits insulated by means of a pn junction. The conductive connection may, however, also be produced via a trench, out which of dopant of the first conductivity type is diffused, and which is then filled with polycrystalline or monocrystalline silicon or with an insulator, such as silicon dioxide.

The drain connections and the source zones may be arranged in the form of strips or like cells. In the case of a gate electrode provided in the semiconductor layer, this electrode is planted in a trench which surrounds the drain zone. The source zone is arranged outside the trench and is electrically connected to the semiconductor substrate by means of the conductive connection, which preferably comprises a deep trench with a conductive wall composed, for example, of titanium nitride.

The conductive connections may be arranged as required; for example, they may be provided in the form of cells between drain zones in the form of strips, or may themselves be in the form of strips.

Other features which are considered as characteristic for the invention are set forth in the appended claims.

Although the invention is illustrated and described herein as embodied in a power MOSFET, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
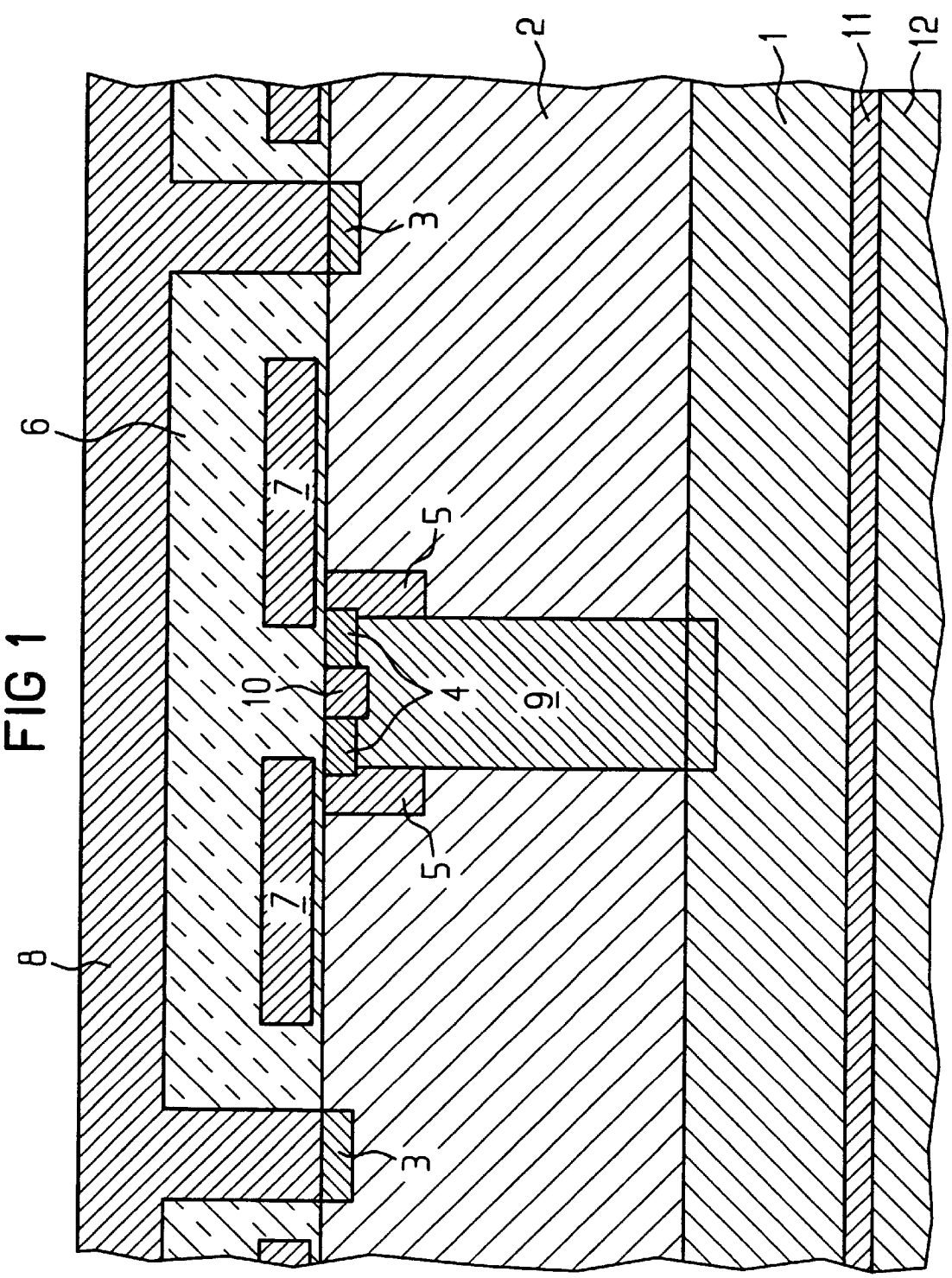
FIG. 1 is a sectional view taken through first exemplary embodiment of the MOSFET according to the invention.

Referring now to the figures of the drawing in detail and first, particularly, to FIG. 1 thereof, there is seen a section through a silicon semiconductor substrate 1 which is $p^{++}$-conductive, that is to say it is highly doped with, say, boron. An n-conductance-type semiconductor layer 2 is applied epitaxially onto the semiconductor substrate 1. There are provided in the layer 2 $n^+$-conductance-type drain zones 3 and $n^+$-conductance-type source zones 4. A p-conductance-type channel zone 5 is formed between the source zones 4 and the drain zones 3.

The zones 3, 4 and 5 may each have an annular shape.

An insulator layer 6 which is composed of silicon dioxide and into which there are embedded gate electrodes 7 composed of polycrystalline silicon is provided on the surface of the semiconductor layer 2. The drain zones 3 make contact with an aluminum metallization 8.

A conductive connection composed of a $p^+$-conductance-type zone 9 is located between the semiconductor substrate 1 and the source zone 4. The zone 9 is connected to the source zone 4 via a metal 10, for example a silicide or titanium nitride.

An electrode composed, for example, of aluminum, is applied to the "lower face" of the substrate 1 and is connected to a cooling fin 12 comprising a relatively thick metal layer, by means of which the MOSFET can be screwed, for example, to the bodywork automobile.

One essential feature of the present invention is that there is a conductive connection to the semiconductor substrate 1 from the source zone 4 via the metal 10 and the highly doped zone 9, so that the source zone makes contact with "underneath" via the electrode 11 ("Source-Down-MOSFET").

The metal 10 produces a short circuit between the source zone 4 and the $p^+$-conductive zone 9. As mentioned above, a silicide or else, for example, titanium nitride may be used for this metal 10. The insulator layer 6 is deposited over this short-circuit point. Another option is for the metallization 8 to be interrupted over the short-circuit point. In any case, the metal 10 extends as far as the outer surface of the conductor layer 2.

The gate electrodes 7 are arranged in a grid array and are preferably composed of $n^+$-conductance-type polycrystalline silicon, which is embedded in the insulator layer 6, which is composed of silicon dioxide or other suitable insulating material.

The $n^+$-conductance-type drain zones 3 make contact with the aluminum metallization 8 over the entire surface. The distance between the zones 3 and the edge of the gate electrode 7 should range from a few tenths of 1 $\mu$m to approximately 5 $\mu$m, in order to achieve a high withstand voltage. For the same reason, it is also possible to allow the thickness of the insulator layer 6 to increase in steps or continuously underneath the gate electrode in the direction of the drain zone 3, although this is not shown in FIG. 1. The drain zone 3 may also be located higher or lower than the source zone 4.

Figure 2:
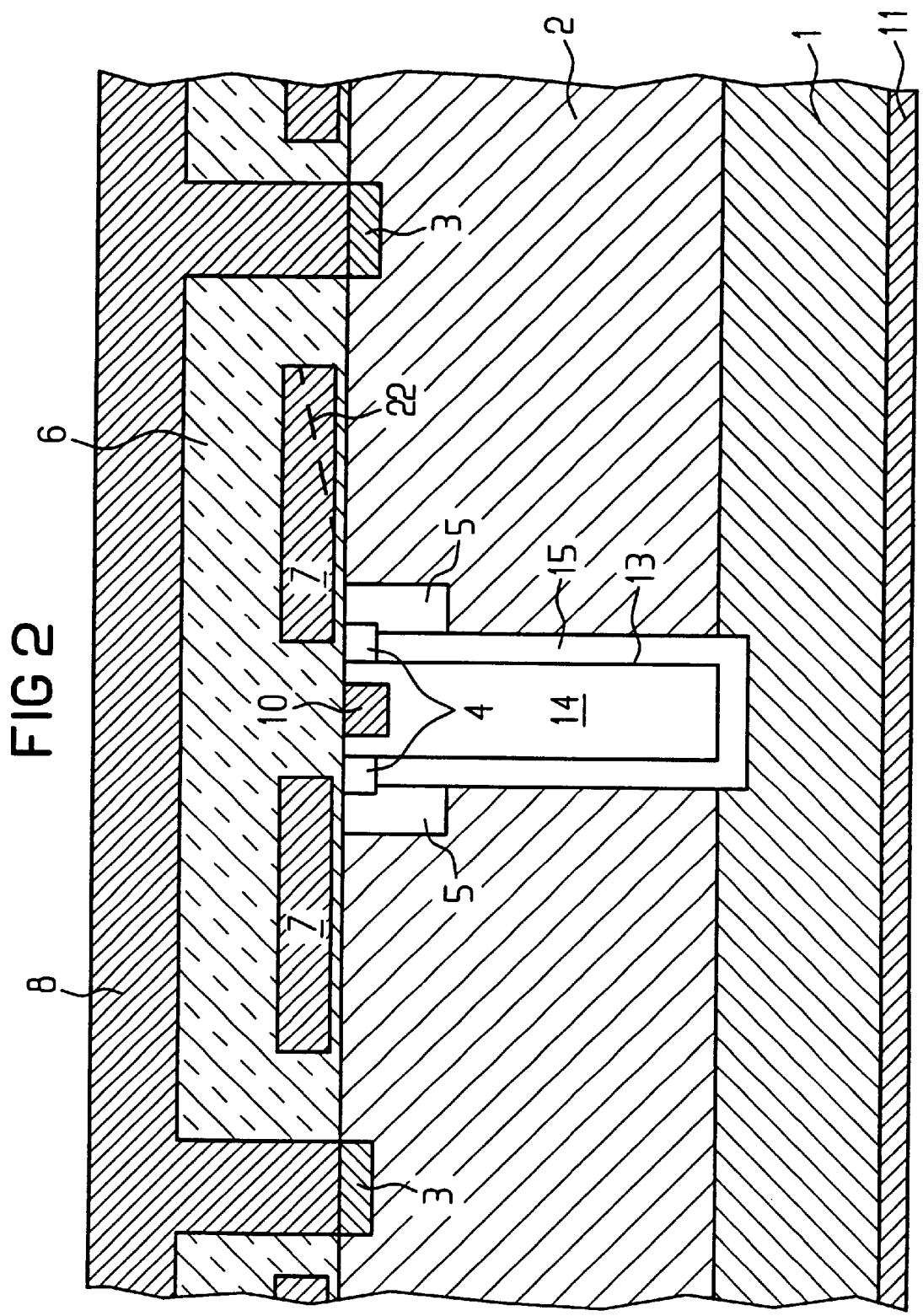
FIG. 2 is a sectional view taken through a second exemplary embodiment of the MOSFET according to the invention.

Referring now to FIG. 2, there is shown a further exemplary embodiment of the power MOSFET according to the invention, which differs from the exemplary embodiment shown in FIG. 1 in that the conductive connection comprises a trench 13 which is filled with $p^+$-conductance-type polycrystalline or monocrystalline silicon 14, out of which a $p^+$-conductance-type zone 15 is diffused into the semiconductor layer 2. A dashed line 22 indicates how the thickness of the insulator layer 6 may increase continuously in the direction of the drain zone 3, underneath the gate electrode 7, whose lower face is indicated by this dashed line 22.

Figure 3:
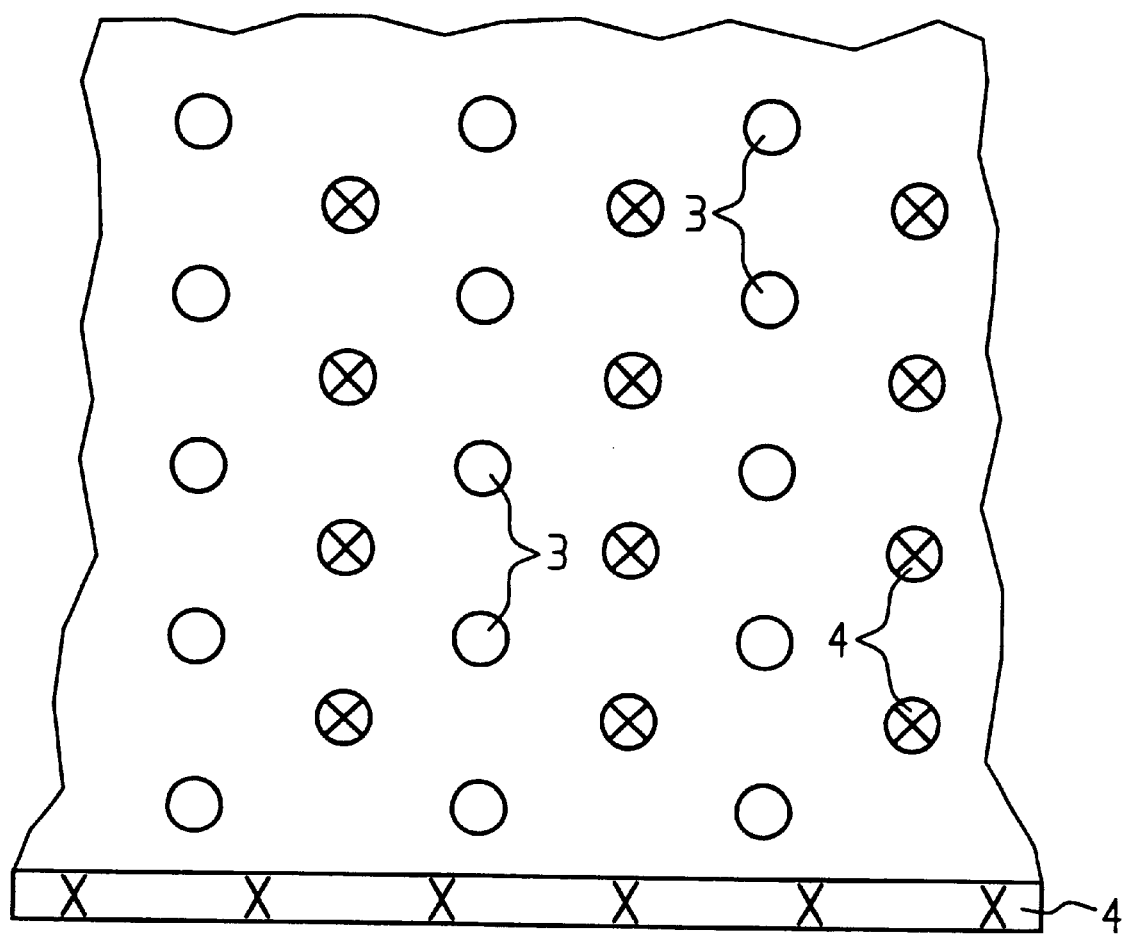
FIG. 3 is a partial plan view illustrating the position of source zones and drain zones in a cell arrangement having a plurality of power MOSFETs.

FIG. 3 shows a plan view of a large number of power MOSFETs, in this case showing how the respective source zones 4 and drain zones 3 can be arranged, and with the edge of this arrangement being in the form of source strips.

Figure 4:
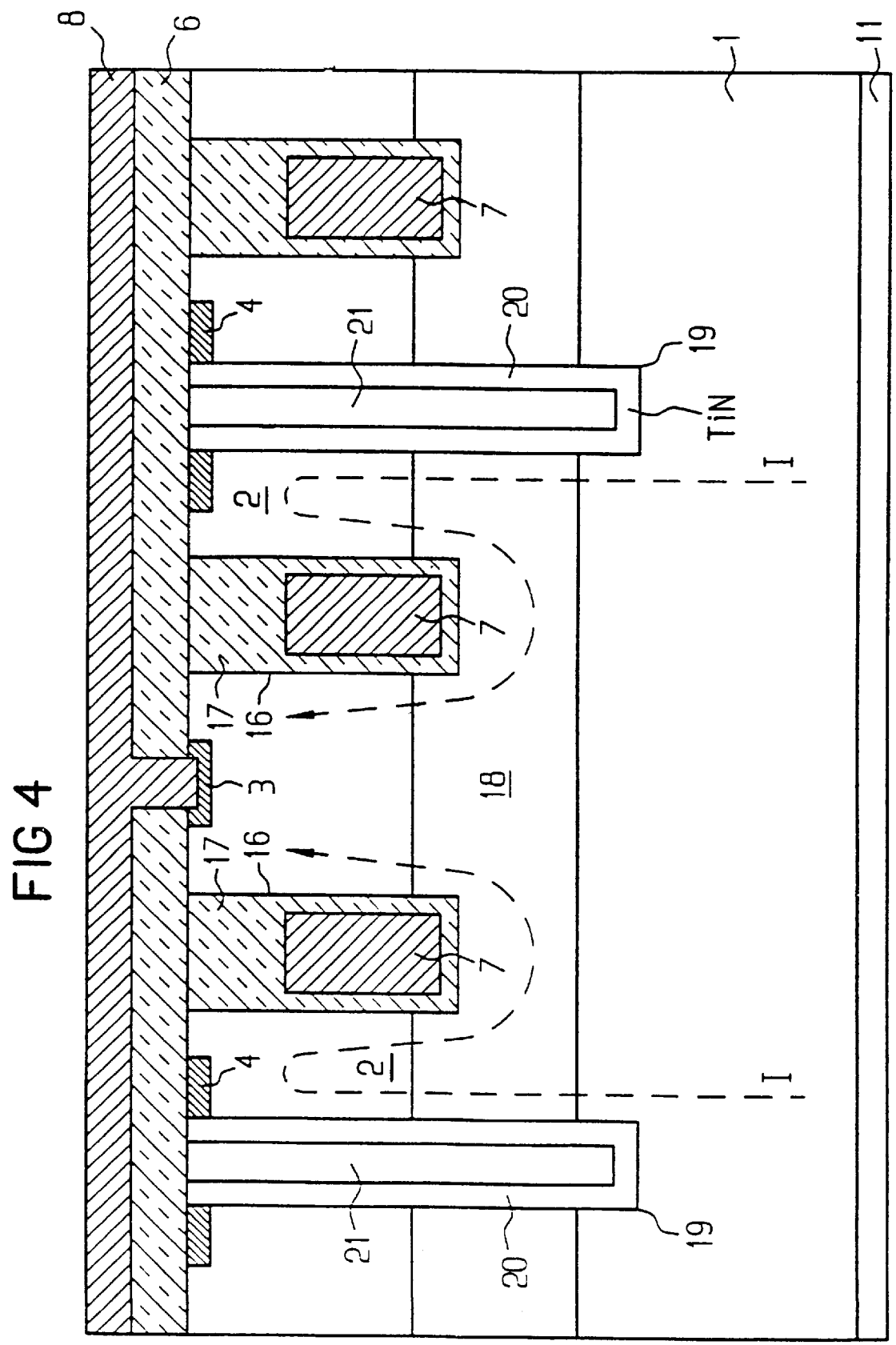
FIG. 4 is a sectional view taken through a third exemplary embodiment of the invention.

The exemplary embodiments in FIGS. 1 and 2 show a power MOSFET in which the gate electrodes are arranged in the "traditional" manner. In contrast to this, FIG. 4 shows a section through a power MOSFET in which the gate electrodes 7 are accommodated in trenches 16 which are filled with insulating material 17, such as silicon dioxide, which contains $n^+$-doped polycrystalline silicon. These trenches 16 extend as far as a $p^-$-conductance-type layer 18 which is arranged between the $p^+$conductance-type silicon substrate 1 and the $n^-$-conductance-type silicon layer 2.

The conductive connection between the source zones 4 and the semiconductor substrate 1 is in this case provided via trenches 19 which are filled with highly conductive material, such as titanium nitride 20 at their edge, and with n⁺-conductance-type polycrystalline silicon 21 in their interiors. Instead of the polycrystalline silicon, an insulator, for example silicon dioxide or silicon nitride, may also be used, which may have a cavity. A metal such as tungsten may also be introduced into the trenches, for the conductive connection.

The layer thicknesses are, for example, 0.2 mm for the semiconductor substrate 1, 2 μm for the p⁻-conductance-type layer 18, 3 μm for the "height" of the gate electrodes 7, and 4 μm for the n⁻-conductance-type semiconductor layer 2, which may have a resistivity of for example, 0.5 Ohm cm. The distance between the trenches 16 may be approximately 4 μm, with each trench 16 having a width of approximately 1 μm. The trenches 19 may also have a width of approximately 1 μm.

FIG. 4 shows the profile of the current I by means of a dashed line, the current passes from the electrode 11 though the semiconductor substrate 1, the p⁻-conductance-type layer 18 into the n⁻-conductance-type layer 2, and from there around gate electrode 7 to the drain zone 3.

The trenches 19 together with the short circuit between the semiconductor substrate 1 and the source zones 4 may be arranged as required. For example, they may be provided in the form of cells between drain zones 3 in the form of strips, and, if required, may likewise be in the form of strips.

I claim:

1. A power MOSFET, comprising:
   a highly doped semiconductor substrate of a first conductivity type having a surface;
   an electrode disposed on said surface of said semiconductor substrate;
   a semiconductor layer of a second conductivity type on said semiconductor substrate;
   a highly doped source zone of the second conductivity type and a highly doped drain zone of the second conductivity type formed in said semiconductor layer;
   a semiconductor zone of the first conductivity type and a gate electrode above said semiconductor zone, said gate electrode having an edge spaced apart from said drain zone by a spacing distance; and
   a highly metallic conductive connection between said source zone and said surface of said semiconductor substrate, said source zone being electrically connected to said electrode disposed on said surface of said semiconductor substrate, opposite said semiconductor layer.

2. The power MOSFET according to claim 1, which further comprises an insulator layer on said semiconductor layer, said gate electrode being formed in said insulator layer.

3. The power MOSFET according to claim 1, wherein said gate electrode is formed in a trench in said semiconductor layer.

4. The power MOSFET according to claim 1, wherein said conductive connection is a highly doped semiconductor zone of the first conductivity type.

5. The power MOSFET according to claim 1, wherein said conductive connection is a trench with out-diffused dopant of the first conductivity type and filled with silicon selected from the group consisting of polycrystalline and monocrystalline silicon.

6. The power MOSFET according to claim 1, wherein said conductive connection is a trench at least partially filled with a metal.

7. The power MOSFET according to claim 6, wherein said metal is tungsten.

8. The power MOSFET according to claim 6, wherein an interior of said trench is filled with one of an insulator and polycrystalline silicon doped with dopant of the first conductivity type.

9. The power MOSFET according to claim 1, wherein said conductive connection is a trench at least partially filled with a highly conductive layer.

10. The power MOSFET according to claim 9, wherein said highly conductive layer is formed of titanium nitride.

11. The power MOSFET according to claim 9, wherein an interior of said trench is filled with one of an insulator and polycrystalline silicon doped with dopant of the first conductivity type.

12. The power MOSFET according to claim 1, which comprises a cooling device connected to said semiconductor substrate.

13. The power MOSFET according to claim 12, wherein said cooling device is composed of metal.

14. The power MOSFET according to claim 3, wherein said semiconductor layer is more lightly doped between said drain zone and said gate than said drain zone.

15. The power MOSFET according to claim 4, which comprises a buried metal area between said source zone and said highly doped semiconductor zone.

16. The power MOSFET according to claim 5, which comprises a buried metal area between said source zone and said silicon filling said trench.

17. The power MOSFET according to claim 1, wherein said spacing distance between said drain zone and said edge of said gate electrode is 0.1 μm to 5 μm.

18. The power MOSFET according to claim 2, wherein a thickness of said insulator layer below said gate electrode increases continuously in a direction towards said drain zone.

19. The power MOSFET according to claim 2, wherein a thickness of said insulator layer below said gate electrode increases in steps in a direction towards said drain zone.

20. The power MOSFET according to claim 3, which further comprises a lightly doped semiconductor layer of the first conductivity type between said semiconductor substrate and said semiconductor layer of the other conductivity type.

21. The power MOSFET according to claim 1, wherein said semiconductor substrate has a layer thickness of substantially 0.2 mm.

22. The power MOSFET according to claim 20, wherein said semiconductor layer of the first conductivity type has a layer thickness of substantially 2 μm.

23. The power MOSFET according to claim 3, wherein said gate electrode has a layer thickness of substantially 3 μm.

24. The power MOSFET according to claim 23, wherein said gate electrode has a width of approximately 1 μm.

25. The power MOSFET according to claim 1, wherein said semiconductor layer of said second conductivity type has a layer thickness of approximately 4 μm.

26. The power MOSFET according to claim 1, wherein said conductive connection has a width of substantially 1 to 2 μm.

27. The power MOSFET according to claim 8, wherein said insulator is formed with a cavity.

* * * * *